United States Patent [19]

Glover et al.

[11] Patent Number: 4,616,183
[45] Date of Patent: Oct. 7, 1986

[54] METHOD FOR REDUCING BASELINE ERROR COMPONENTS IN NMR SIGNALS

[75] Inventors: Gary H. Glover, Waukesha; James R. MacFall, Hartland, both of Wis.

[73] Assignee: General Electric Company, Milwaukee, Wis.

[21] Appl. No.: 663,659

[22] Filed: Oct. 22, 1984

[51] Int. Cl.⁴ ............................................. G01R 33/20
[52] U.S. Cl. .................................... 324/309; 324/314; 324/313
[58] Field of Search ............... 324/300, 307, 309, 310, 324/311, 312, 314, 318, 322

[56] References Cited

U.S. PATENT DOCUMENTS

| 3,781,650 | 12/1973 | Keller | 324/0.5 R |
| 4,015,196 | 3/1977 | Moore | 324/309 |
| 4,021,726 | 5/1977 | Garroway | 324/309 |
| 4,052,661 | 10/1977 | Higham | 324/322 |
| 4,115,730 | 9/1978 | Mansfield | 324/309 |
| 4,184,110 | 1/1980 | Hinshaw | 324/313 |
| 4,443,760 | 4/1984 | Edelstein et al. | 324/309 |
| 4,564,017 | 1/1986 | Glover | 324/300 |
| 4,567,893 | 2/1986 | Charles et al. | 324/309 |

Primary Examiner—Michael J. Tokar
Attorney, Agent, or Firm—Alexander M. Gerasimow; Douglas E. Stoner

[57] ABSTRACT

A method for reducing baseline errors in NMR signals utilizes NMR signals produced by RF excitation pulses selected to be 180° out of phase relative to one another to derive a baseline error signal. The baseline error signal is then used to compensate for baseline error component in other NMR signals. In the preferred embodiment, the method is useful in NMR imaging pulse sequences to not only achieve compensation of the baseline error, but also to shorten scan time.

19 Claims, 3 Drawing Figures

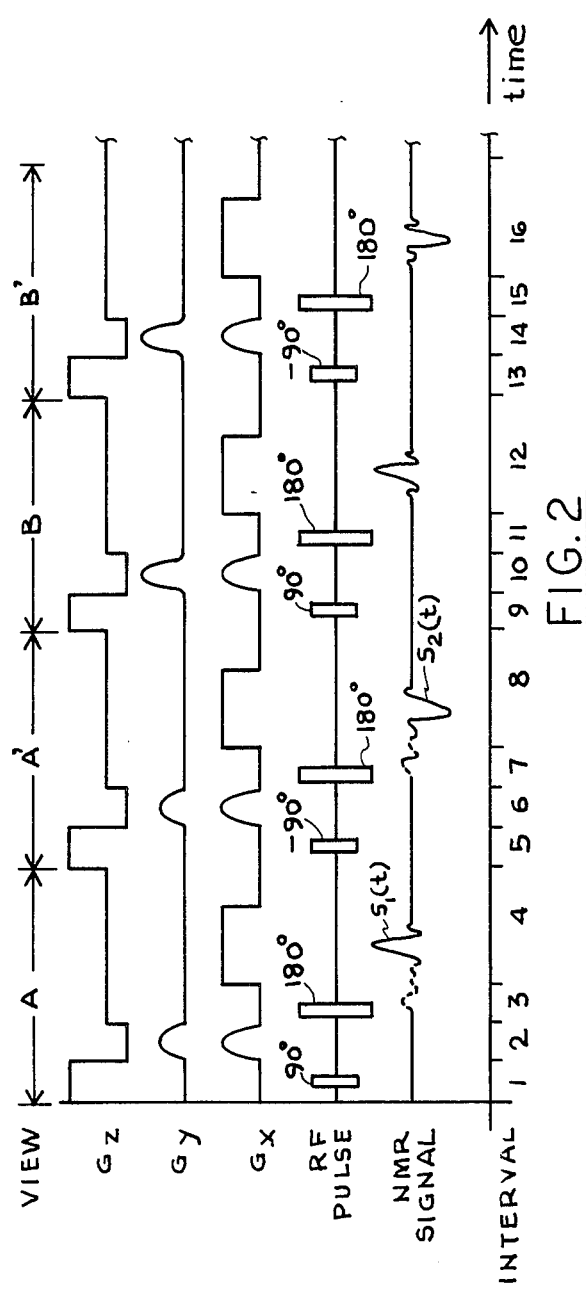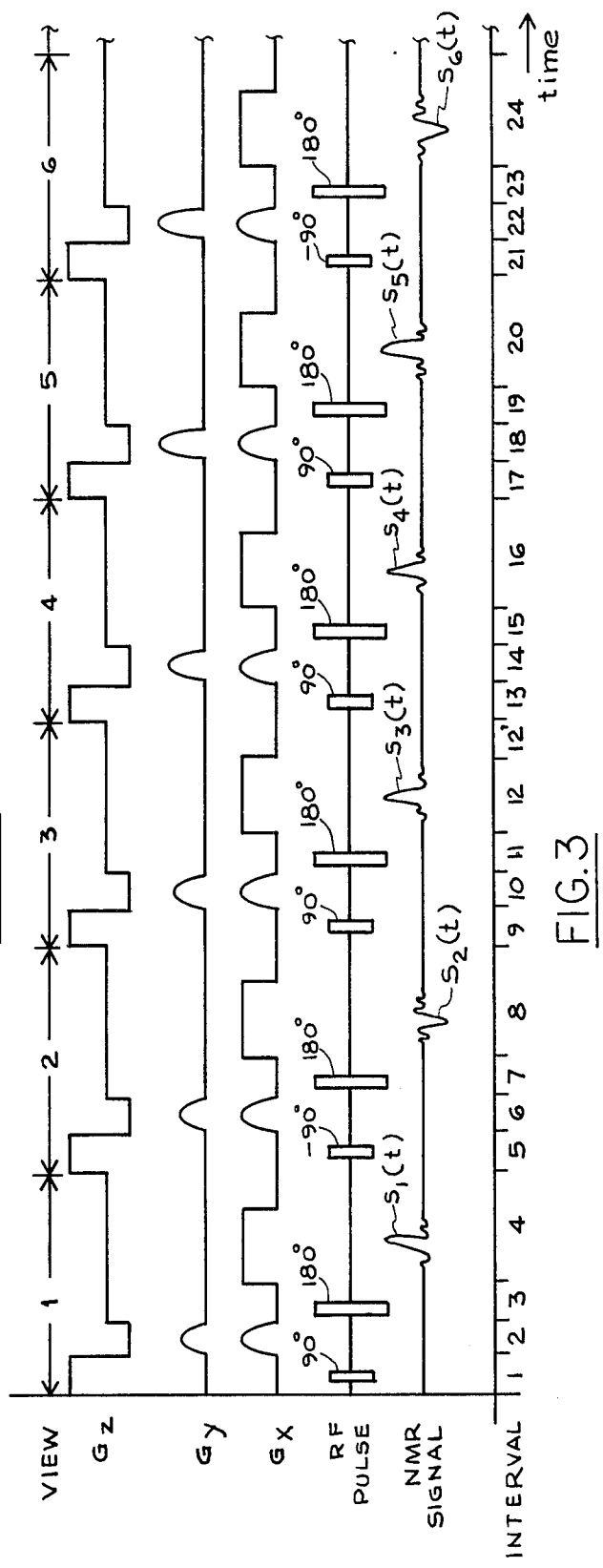

METHOD FOR REDUCING BASELINE ERROR COMPONENTS IN NMR SIGNALS

BACKGROUND OF THE INVENTION

This invention relates to a method for performing nuclear magnetic resonance (NMR) studies. More specifically, this invention relates to an NMR method useful for performing NMR studies in a shorter time than with conventional schemes, but with substantially the same reduction in baseline error.

U.S. Pat. No. 3,781,650 discloses a method for reducing interference in the receiver of a spin resonance spectrometer. In accordance with the method, a first set of radio frequency (RF) excitation pulses of one phase angle, and a second set of RF excitation pulses which are 180° out of phase with the first set are generated. The free precession decay signals produced by one set of pulses is subtracted from the free precession decay signals produced by the other set. The signals from the excited sample reinforce, while the interference signals cancel.

The method is disclosed in the above-identified Patent with respect to an NMR analytical spectrometer and, therefore, is not concerned with scan-time reduction and magnetic field gradients effects, as is the case in NMR studies of human subjects. Scan-time reduction is important in the study of human subjects to increase patient throughput in the case of medical application of NMR and to decrease the likelihood of patentmotion artifacts. Magnetic field gradients are needed in NMR studies, such as imaging, to encode spatial information into the NMR signal to enable image reconstruction.

U.S. Pat. No. 4,443,760, assigned to the same assignee as the present invention and which is incorporated herein by reference, discloses and claims a method for eliminating interference from spurious free induction decay (FID) signals created by imperfect 180° RF time-reversal pulses utilized to produce NMR spin-echo signals. One way this is accomplished is to phase shift by 180° relative to one another successive excitation pulses and subtracting the resulting NMR signals thereby eliminating the spurious FID signals. This method is also effective in eliminating other error components such as d.c. voltage offsets and residual effects associated with magnetic field gradients. The spurious FID signals, d.c. voltage offsets and residual effects of gradients will be hereinafter collectively referred to as "baseline error component." Another way to eliminate the effects of spurious FID is to phase shift successive spin-echo-producing 180° RF pulses and to add the NMR signals. The spurious FID signals are phase shifted and cancel, while the desired signals reinforce.

A drawback associated with the use of phase-alternated RF excitation of the type described above with reference to U.S. Pat. No. 4,443,760, is that in NMR imaging applications portions of the imaging pulse sequence are repeated with the sign of the 90° RF pulse reversed. In some applications, this may be desirable, since not only is the noise removed, but the signal-to-noise ratio is improved. In some systems, notably those utilizing high magnetic fields, the signal-to-noise ratio may not require enhancement. In this case, the method results in unnecessarily lengthening the data collection process.

Accordingly, it is an object of the present invention to provide a method for substantially eliminating the baseline error component, while shortening the data collection time.

SUMMARY OF THE INVENTION

A method of performing NMR studies of a sample object includes multiple steps of exciting nuclear spins in a region of the sample object, and receiving the resulting NMR signals. The method further includes irradiating the sample object with at least one pair of RF pulses which are 180° out of phase relative to one another. The NMR signals due to the pair of RF pulses are used to derive a baseline error signal which can be used to compensate for the baseline error components in other NMR signals.

In one embodiment, the method is utilized with NMR imaging methods to shorten scan time, while achieving significant reduction of baseline error components.

BRIEF DESCRIPTION OF THE DRAWINGS

The features of the invention believed to be novel are set forth with particularity in the appended claims. The invention itself, however, both as to its organization and method of operation, together with further objects and advantages thereof, my best be understood by reference to the following description taken in conjunction with the accompanying drawings in which:

FIG. 2 depicts an exemplary imaging pulse sequence over which the invention is an improvement; and FIG. 3 depicts an exemplary embodiment of the invention with reference to an imaging pulse sequence.

DETAILED DESCRIPTION OF THE INVENTION

Figure 1:
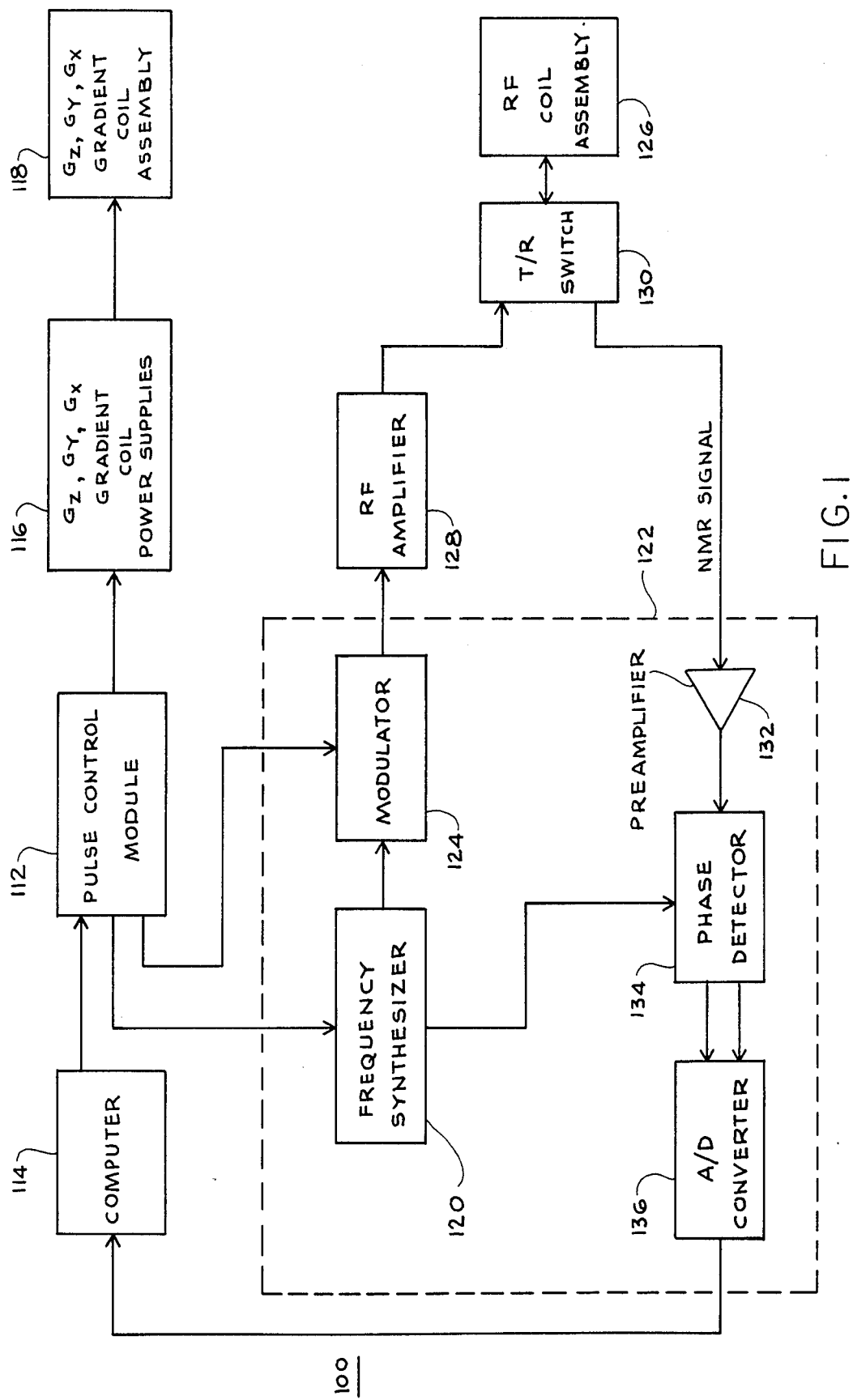
FIG. 1 depicts in block schematic form part of an exemplary NMR system useful for practicing the invention.

FIG. 1 is a simplified block diagram of an NMR imaging system with respect to which the preferred embodiment of the invention will be disclosed. It should be recognized, however, that the claimed invention may be advantageously practiced with any suitable apparatus. The system, generally designated 100, includes a pulse control module 112 which provides properly timed pulse signals under the control of a host computer 114 to magnetic field gradient power supplies collectively designated 116 for energizing gradient coils which form part of a gradient coil assembly generally indicated by a block 118. The assembly contains coils which, when energized by the power supplies, produce the $G_x$, $G_y$, and $G_z$ magnetic field gradients directed in the x, y, and z directions, respectively, of the Cartesian coordinate system. The use of the $G_x$, $G_y$, and $G_z$ gradients in NMR imaging applications will be described hereinafter with reference to FIGS. 2 and 3.

Continuing with reference to FIG. 1, the pulse control module provides activating pulses to an RF synthesizer 120 which is part of an RF transceiver system, portions of which are enclosed by dash-line block 122. The pulse control module also supplies modulating signals to a modulator 124 which modulates the output of the RF frequency synthesizer. The modulated RF signals are applied to an RF coil assembly 126 through an RF power amplifier 128 and a transmit/receive switch 130. The RF signals are used to excite nuclear spins in a sample object (not shown) undergoing examination.

The NMR signals from the excited nuclear spins are picked up by the RF coil assembly and applied through the transmit/receive switch to an RF preamplifier 132 and then to a quadrature phase detector 134. The detected signals are digitized by A/D converter 136 and applied to computer 114 for processing in a well-known manner to, for example, reconstruct NMR images in the sample.

FIG. 2 depicts four views of what can now be referred to as a conventional imaging pulse sequence of the type known as two-dimensional Fourier transform (2DFT) and which is frequently also referred to as "spin warp." This pulse sequence is useful in obtaining, in a well-known manner, imaging data to reconstruct images of a sample being investigated. The pulse sequence also utilizes phase-alternated RF excitation pulses which, as disclosed and claimed in the aforeidentified U.S. Pat. No. 4,443,760 and as will be briefly described hereinbelow, produce phase-alternated NMR signals. When these signals are subtracted, those signal components having an inverted phase reinforce, while baseline error components whose phase was not phase reversed cancel.

The manner in which this is accomplished in the conventional pulse sequence will now be described with reference to FIG. 2 which depicts four phase-encoding views A, A', B, and B' of a pulse sequence which can in reality contain, for example, 128, 256, or 512 phase-encoding views. Referring now to View A in FIG. 2, there is shown in interval 1 (indicated along the horizontal axis) a selective 90° RF excitation pulse applied in the presence of a positive $G_z$ magnetic field gradient pulse. Pulse control module 12, FIG. 1, provides the needed control signals to the frequency synthesizer and modulator so that the resulting excitation pulse is of the correct frequency and is properly modulated to excite nuclear spins only in a predetermined region of the sample. Typically, the excitation pulse can be amplitude modulated by a sin x/x function. The frequency of the pulse is dependent on the strength of the applied magnetic field and the NMR species being imaged in accordance with the well-known Larmor equation. The pulse control module also applies activating signals to the gradient power supplies to generate, in this case, the $G_z$ gradient pulse.

Continuing with reference to FIG. 2, $G_x$, $G_y$, and $G_z$ gradient pulses are applied simultaneously in interval 2. The $G_z$ gradient in interval 2 is a rephasing pulse typically selected such that the time integral of the gradient waveform over interval 2 is approximately equal to $-\frac{1}{2}$ of the time integral of the gradient waveform over interval 1. The function of this $G_z$ pulse is to rephase the nuclear spins excited in interval 1. The $G_y$ gradient pulse is a phase-encoding pulse selected to have a different amplitude in each of Views A, B, ..., etc., to encode spatial information in the direction of the gradient. In the embodiment of FIG. 2, the amplitude of the $G_y$ gradient in Views A' and B' is selected to be equal to that in Views A and B, respectively. The number of different $G_y$ gradient amplitudes is typically selected to equal at least the number of pixel elements the reconstructed image will have in the Y-axis direction. Typically, 128, 256 or 512 gradient amplitudes are selected.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin echo is produced by the application of a, typically, non-selective 180° RF pulse in interval 3. As is known, the 180° RF pulse is a time-reversal pulse which reverses the direction of spin dephasing so as to produce the spin-echo signal. The spin-echo signal is sampled in interval 4 in the presence of a linear $G_x$ gradient pulse to encode spatial information in the direction of the gradient.

Precise time-reversal pulses are difficult to produce. In practice, imperfect pulses do not reverse the direction of nuclear spins by exactly 180° throughout the sample object region of interest. In some parts of the region, the nuclear spins are rotated by less than or greater than 180°, creating a transverse magnetization component which is responsible for a spurious NMR signal (shown by dashed lines in Views A and A', FIG. 2) which is unavoidably detected along with the desired spin-echo signal. The spurious NMR signal, along with other baseline error components can produce objectionable image artifacts.

In the pulse sequence of FIG. 2, the baseline error is eliminated by using an additional phase-encoding View A'. View A' is substantially identical to phase-encoding View A, with the exception that the RF excitation pulse in interval 5 of View A' is selected to be 180° out of phase (as suggested by the minus sign) relative to the excitation pulse in interval 1 of View A, so that the resulting spin-echo signal $S_2(t)$ in interval 8 is 180° out of phase with the spin-echo signal $S_1(t)$ in interval 4. The phase of the spurious FID signal occurring in intervals 7 and 8 due to the 180° RF pulse in interval 7, however, remains the same relative to the FID signal in interval 3. In this manner, if signals $S_1(t)$ and $S_2(t)$ are subtracted, only those components of the signals with reversed (negative) sign in the signal $S_2(t)$ are retained. The baseline error components cancel.

The operation of cancelling the baseline error can be summarized by considering equations $$S_1(t) = S(t) + b(t), \tag{1}$$

$$S_2(t) = -S(t) + B(t), \tag{2}$$

in which $S_1(t)$ and $S_2(t)$ represent the spin-echo signals in intervals 4 and 8, respectively, S(t) is the desired component of the NMR signal, and B(t) is the baseline error component. The usual manner in which signals $S_1(t)$ and $S_2(t)$ are processed is $$S(t) = \frac{1}{2}[S_1(t) - S_2(t)], \tag{3}$$

which results in the elimination of the constant baseline error component B(t). The operation indicated in Equation (3) also provides the expected $\sqrt{2}$ improvement in signal-to-noise ratio due to the averaging of the two signals.

The process described above with reference to phase encoding Views A and A' is repeated for Views B and B' and so on for all amplitudes of the phase-encoding $G_y$ gradient.

The use of the pulse sequence depicted in FIG. 2 to eliminate baseline error components necessarily means that the minimum number of averages is two. With high-field imaging systems, however, the intrinsic signal-to-noise ratio can be high enough that two averages are not needed to produce a useful image. This means that the data collection time in situations not requiring the $\sqrt{2}$ advantage in signal-to-noise ratio is unnecessarily doubled.

Prior to the present invention, there has been no satisfactory method for eliminating the baseline error without replicating phase-encoding Views (e.g., A—A', B—B', etc., FIG. 2).

In accordance with the invention, it has been recognized that, if signals $S_1(t)$ and $S_2(t)$, represented by Equations (1) and (2), respectively, are added instead of subtracted, the baseline error signal B(t) can be recovered, rather than the desired NMR signal S(t). That is $$B(t) = \tfrac{1}{2}[S_1(t) + S_2(t)]. \qquad (5)$$

If the baseline signal obtained using Equation (5) were independent of the phase-encoding gradient $G_y$, then it could be determined once using, for example, signals $S_1(t)$ and $S_2(t)$ obtained in Views A and A', FIG. 2. This baseline signal could then be used to compensate for the baseline error in all spin-echo signals corresponding to each amplitude of the phase-encoding gradient in subsequent views.

It has been determined, however, that there is sufficient variation in B(t) as $G_y$ is stepped through its range of amplitudes, that one value of B(t) does not accurately span the entire data set comprised of all views. In accordance with the invention, it has been found, however, that, if a new baseline error B(t) is determined periodically, for example, for every 4'th or 8'th ($N_b=4$ or 8) amplitude of the phase-encoding gradient $G_y$, then the B(t) signal follows the changes due to phase-encoding gradient $G_y$ to provide adequate compensation for the baseline error. It will be appreciated that $N_b=4$ and 8 are used as illustrative examples and that the invention can be successfully practiced with other values.

In general, therefore, in accordance with the invention, it is necessary to replicate phase-encoding $G_y$ gradient amplitudes with phase-alternated excitation pulses only every $N_b$ views starting, for example, at the ($N_b/2$)th view. In one embodiment of the invention, the baseline signal B(t), computed using Equation (5), could be used to compensate for the signals nearest to a given view. A new B(t) signal would be used every $N_b$ views.

A preferred imaging pulse sequence employing the method of the invention will be described next with reference to FIG. 3.

FIG. 3 depicts six views of a 2DFT pulse sequence similar to that of FIG. 2 but which includes one embodiment of the inventive method. In this embodiment, $N_b$ has been selected to be 4 so that the first phase-alternated RF excitation pulse occurs in interval 5, FIG. 3, resulting in a spin-echo signal $S_2(t)$ which is 180° out of phase with the signal $S_1(t)$. Subsequent phase-alternated RF pulses occur every four views, with the next one occurring in interval 21 of View 6. If, for example, $N_b$ were selected to be 8, then the first phase-alternated excitation pulse would occur at View 4, and then every eight views at Views 12, 20, . . . etc.

Referring again to FIG. 3, in accordance with the invention, signals $S_1(t)$ and $S_2(t)$ (obtained at identical $G_y$ gradient amplitudes) would be used as in Equation (3) to compensate for baseline error in Views 1 and 2. Additionally, signals $S_1(t)$ and $S_2(t)$ would be used in Equation (5) to calculate a baseline signal $B_1(t)$. The $B_1(t)$ signal is used to compensate for the error in signal $S_3(t)$ (in View 3) which is closest to signals $S_1(t)$ and $S_2(t)$ in Views 1 and 2, respectively. Thus, corrected signal $S'_3(t)$ is obtained by subtracting $B_1(t)$ from the observed signal $S_3(t)$. Similarly, signals $S_5(t)$ and $S_6(t)$ (also obtained at identical $G_y$ gradient amplitudes) occurring in intervals 20 and 24, respectively) are used to compensate for errors in Views 5 and 6 and also to calculate a new baseline error signal $B_2(t)$. Signal $B_2(t)$ is used to compensate for baseline error components in signal $S_4(t)$ in interval 16 and signal $S_7(t)$ (not shown). For this example, it is seen that $G_y$ gradient amplitudes are identical in views 1 and 2, incremented in views 3, 4, and 5, and identical in views 5 and 6.

In some circumstances, it may be advantageous to use interpolation (e.g., linear) to calculate an interpolated baseline error value B'(t) using $B_1(t)$ and $B_2(t)$. The interpolated value B'(t) would then be used to compensate for baseline error components in signals $S_3(t)$ and $S_4(t)$. Similar interpolated values would be calculated for baseline errors $B_i(t)$, $i = 3, 4, \ldots$, etc.

The use of the inventive method results in a scan time reduction by a factor of $(1 + 1/N_b)/2$ relative to the pulse sequence of FIG. 2. Thus, for $N_b = 4$ and 8 the reduction in time is by factors of ⅝ and 9/16, respectively.

The preferred embodiments of the invention have been disclosed hereinbefore by way of example with reference to a 2DFT pulse sequence. It will be recognized by those skilled in the art that the invention could also be practiced with a three-dimensional embodiment of the sequence. In this case, variable amplitude $G_z$ phase-encoding gradient pulses would be applied in intervals 2, 6, 10, 14, etc., of FIG. 3 to encode spatial image information in the Z-axis direction. A three-dimensional spin-warp pulse sequence is disclosed and claimed in U.S. Pat. No. 4,431,968, assigned to the same assignee as the present invention and which is incorporated herein by reference as background material.

It will be further recognized that the invention could also be practiced with other than a Fourier transform type of imaging sequence. Examples of such sequences are two- and three-dimensional implementations of multiple-angle projection reconstruction techniques. In such sequences, NMR projection data is obtained from a plurality of angles (e.g., within at least a 180 degree arc in a two-dimensional implementation) in the sample region of interest. The image is reconstructed by back-projecting the line integral projection data obtained for each direction. The method of the invention is directly applicable to this sequence if each different projection is treated as a view.

The invention may also be practiced with pulse sequences in which the NMR data is acquired by sampling the free-induction decay signals, rather than spin-echo signals as hereinabove. In this case, the phase-alternated excitation pulses result in phase-alternated FID signals which, for the purpose of eliminating baseline error components, are treated as spin-echo signals. The baseline errors associated with FID signals are due to A/D converter offsets and other imprecision in the phase detectors, as well as possible RF leakage into the receiver section of the transceiver system.

The invention can also be advantageously practiced with phase-alternated 180° RF pulses rather than with 90° RF pulses as described hereinbefore. In this embodiment, all of the 90° RF pulses would be of the same phase, with the result that the NMR signals would not be phase-alternated relative to one another. The phase of the 180° RF pulse is reversed by 180° every $N_b$ views, as before. Thus, for example, the 180° RF pulses in intervals 3 and 7, and 19 and 23 in FIG. 3 would be in phase opposition. The phase-alternated 180° RF pulses do not alter the phase of either the $S_1(t), S_2(t) \ldots S_i(t)$ signals or the DC offset signal component. The phase of the spurious FID signals (discussed with reference to FIG. 2), however, would be inverted. In general, the observed signals can be expressed as:

$$S_1(t) = S(t) + S_p(t) + DC, \quad (6)$$

and $$S_2(t) = S(t) - S_p(t) + DC, \quad (7)$$

wherein S(t) designates the desired NMR signal component, $S_p(t)$ designates the spurious FID signal, and DC is the DC offset signal component. In this case, the baseline error component, B(t), is given by $$B(t) = S_p(t) + DC. \quad (8)$$

A value for $S_p(t)$ can be calculated by subtracting $S_1(t)$ and $S_2(t)$, Equations (6) and (7), to yield $$S_p(t) = \tfrac{1}{2}(S_1(t) - S_2(t)). \quad (9)$$

A value for DC can be determined by measuring the output of the A/D converter (FIG. 1) without applying any RF excitation; i.e., in the absence of NMR signals.

The calculated value of $S_p(t)$ and the measured value DC are used to calculate the B(t) value using Equation (8). The B(t) value can then be used to compensate for baseline errors in a manner similar to that described hereinbefore with reference to the inventive embodiment employing phase-alternated 90° RF pulses.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method of performing NMR studies of a sample object, the method including multiple steps of exciting nuclear spins in a region of the sample object and receiving the resulting NMR signals, said method comprising:
    irradiating the sample object with at least one pair of RF pulses which are 180° out of phase relative to one another;
    deriving a first baseline error signal from the NMR signals due to said pair of RF pulses; and
    using the derived baseline error signal to compensate for the baseline error component in at least one other NMR signal.

2. The method of claim 1 wherein said pair of RF pulses comprise a pair of selective 90° RF excitation pulses applied in the presence of magnetic field gradients so as to selectively excite nuclear spins in a predetermined region of said sample object.

3. The method of claim 1 or 2 wherein said baseline error signal is derived using the equation $$B(t) = \tfrac{1}{2}[S_1(t) + S_2(t)],$$

wherein
    B(t) is the baseline error signal,
    $S_1(t)$ is the NMR signal due to one of the pair of RF pulses, and
    $S_2(t)$ is the NMR signal due to the other one of the pair of RF pulses.

4. The method of claim 3 further comprising: subjecting said region of said sample object, following each of said steps of exciting nuclear spins, to at least one programmable amplitude, phase-encoding magnetic field gradient; and
    sampling the received NMR signals in the presence of a linear magnetic field gradient, said phase-encoding and linear magnetic field gradients encoding into said NMR signals spatial information useful for reconstructing an image of a region of the sample object.

5. The method of claim 4 wherein the amplitude of said phase-encoding magnetic field gradient is selected to be substantially identical for each of the RF pulses in said pair.

6. The method of claim 3 further comprising observing the received NMR signals in the presence of a linear magnetic field gradient having a plurality of directions within said region so as to encode sufficient line integral projection data to reconstruct an image of at least a portion of said region.

7. The method of claim 3 further comprising:
    irradiating said sample region with at least one additional pair of RF pulses which are 180° out of phase relative to one another;
    deriving a second baseline error signal from the NMR signals due to said additional pair of RF pulses;
    interpolating said first and second baseline error signals to produce a composite baseline error signal; and
    using said composite baseline error signal to compensate for the baseline error component in at least one other NMR signal.

8. The method of claim 3 wherein the resulting NMR signals comprise spin-echo signals produced by irradiating the excited nuclear spins with a plurality of 180° RF pulses.

9. The method of claim 1 wherein said NMR signals comprise free-induction decay signals.

10. The method of claim 1 wherein said NMR signals comprise spin-echo signals.

11. The method of claim 1 wherein said step of irradiating includes irradiating the sample object with at least a pair of 180° RF pulses which are 180° out of phase relative to one another.

12. The method of claim 18 wherein said baseline error signal is derived using the equation $$B(t) = S_p(t) + DC,$$

herein
    $S_p(t) = \tfrac{1}{2}(S_1(t) - S_2(t))$, where $S_p(t)$ is the desired NMR signal, $S_1(t)$ and $S_2(t)$ are, respectively, NMR signals due to first and second of said 180° RF pulses, and
    DC is the output signal measured in the absence of RF excitation.

13. A method of NMR imaging comprising:
    positioning a sample object to be imaged in a substantially homogeneous magnetic field;
    irradiating the sample object with a plurality of RF pulses so as to excite nuclear spins in a predetermined region to generate a corresponding plurality of NMR signals;
    observing said NMR signals in the presence of a linear magnetic field gradient to encode spatial information concerning at least one parameter associated with the excited nuclear spins; and applying at least one programmable amplitude, phase-encoding magnetic field gradient to said predetermined region prior to said step of observing to phase-encode spatial information concerning at least one parameter associated with the excited nuclear spins, wherein at least a pair of said RF pulses is selected to be 180° out of phase relative to one another and wherein the amplitude of said phase-encoding gradient is selected to be substantially identical for each of the RF pulses in said pair;

deriving a baseline error signal from the NMR signals due to said pair of RF pulses; and compensating for the baseline error component in at least one of the remaining NMR signals.

14. The method of claim 13 wherein said pair of RF pulses comprise a pair of selective 90° RF excitation pulses applied in the presence of magnetic field gradients so as to selectively excite nuclear spins in a predetermined region of said sample object.

15. The method of claim 13 or 14 wherein said baseline error signal is derived using the equation $$B(t) = \tfrac{1}{2}[S_1(t) + S_2(t)],$$

wherein $B(t)$ is the baseline error signal, $S_1(t)$ is the NMR signal due to one of the pair of RF pulses, and $S_2(t)$ is the NMR signal due to the other one of the pair of RF pulses.

16. The method of claim 15 further comprising:

irradiating said sample region with at least one additional pair of RF pulses which are 180° out of phase relative to one another;

deriving a second baseline error signal from the NMR signals due to said additional pair of RF pulses;

interpolating said first and second baseline error signals to produce a composite baseline error signal; and using said composite baseline error signal to compensate for the baseline error component in at least one other NMR signal.

17. The method of claim 15 wherein the NMR signals resulting from said step of irradiating comprise spin-echo signals produced by irradiating the excited nuclear spins with a plurality of 180° RF pulse.

18. The method of claim 13 wherein said NMR signals comprise free-induction decay signals.

19. The method of claim 13 wherein said NMR signals comprise spin-echo signals.

* * * * *